United States Patent [19]

Libby

[11] Patent Number: 5,349,533
[45] Date of Patent: Sep. 20, 1994

[54] SYSTEM AND METHOD FOR COLLISION CHECKING BETWEEN SOLID OBJECTS AND VECTORS

[75] Inventor: Vibeke Libby, San Mateo, Calif.

[73] Assignee: Lockheed Missiles & Space Company, Inc., Sunnyvale, Calif.

[21] Appl. No.: 880,267

[22] Filed: May 8, 1992

[51] Int. Cl.$^5$ ............................................. G06F 15/20
[52] U.S. Cl. .................... 364/461; 364/424.02; 395/90; 318/587
[58] Field of Search ............... 364/461, 424.02, 460; 395/90; 318/587

[56] References Cited

U.S. PATENT DOCUMENTS

| | | | |
|---|---|---|---|
| 4,862,373 | 8/1989 | Meng | 364/444 |
| 4,888,707 | 12/1989 | Shimada | 364/513 |
| 5,047,916 | 9/1991 | Kondo | 364/167.01 |
| 5,056,031 | 10/1991 | Nakano et al. | 364/461 |
| 5,150,026 | 9/1992 | Seraji et al. | 318/568.11 |
| 5,150,452 | 9/1992 | Pollack et al. | 395/90 |
| 5,229,941 | 7/1993 | Hattori | 364/424.02 |

*Primary Examiner*—Thomas G. Black
*Assistant Examiner*—Julie D. Day
*Attorney, Agent, or Firm*—John J. Morrissey

[57] ABSTRACT

A path analyzer for determining if a specified path is blocked by a given solid obstacle in three dimensional space. A programmable comparator converts path endpoints into first and second map signals, wherein each map signal indicates whether the corresponding path endpoint's position on predefined X, Y and Z coordinate axes is above, below or within a range of coordinate values associated with a specified obstacle. The specified obstacle is modelled as a rectangular parallelepiped, regardless of the actual shape of the obstacle. A first high speed decoder uses these map signals to make an initial determination as to whether the specified path is blocked, not blocked, or may be blocked by the specified obstacle. Whenever the first decoder determines that the path may be blocked, a second decoder determines the minimum number of additional computations needed to resolve whether the specified path is blocked. Depending on the number of sides of the specified obstacle that are "in view" of the specified paths's endpoints, one to three pairs of path intersection computations are required. In the preferred embodiments a dedicated computational unit is used to perform the calculations specified by the decoder to resolve whether the specified path is blocked. The dedicated computation unit is preprogrammed to perform six different pairs of computations, corresponding to the six sides of the obstacle. The second decoder determines which pairs of computations have to be performed for any particular path blockage determination.

10 Claims, 7 Drawing Sheets

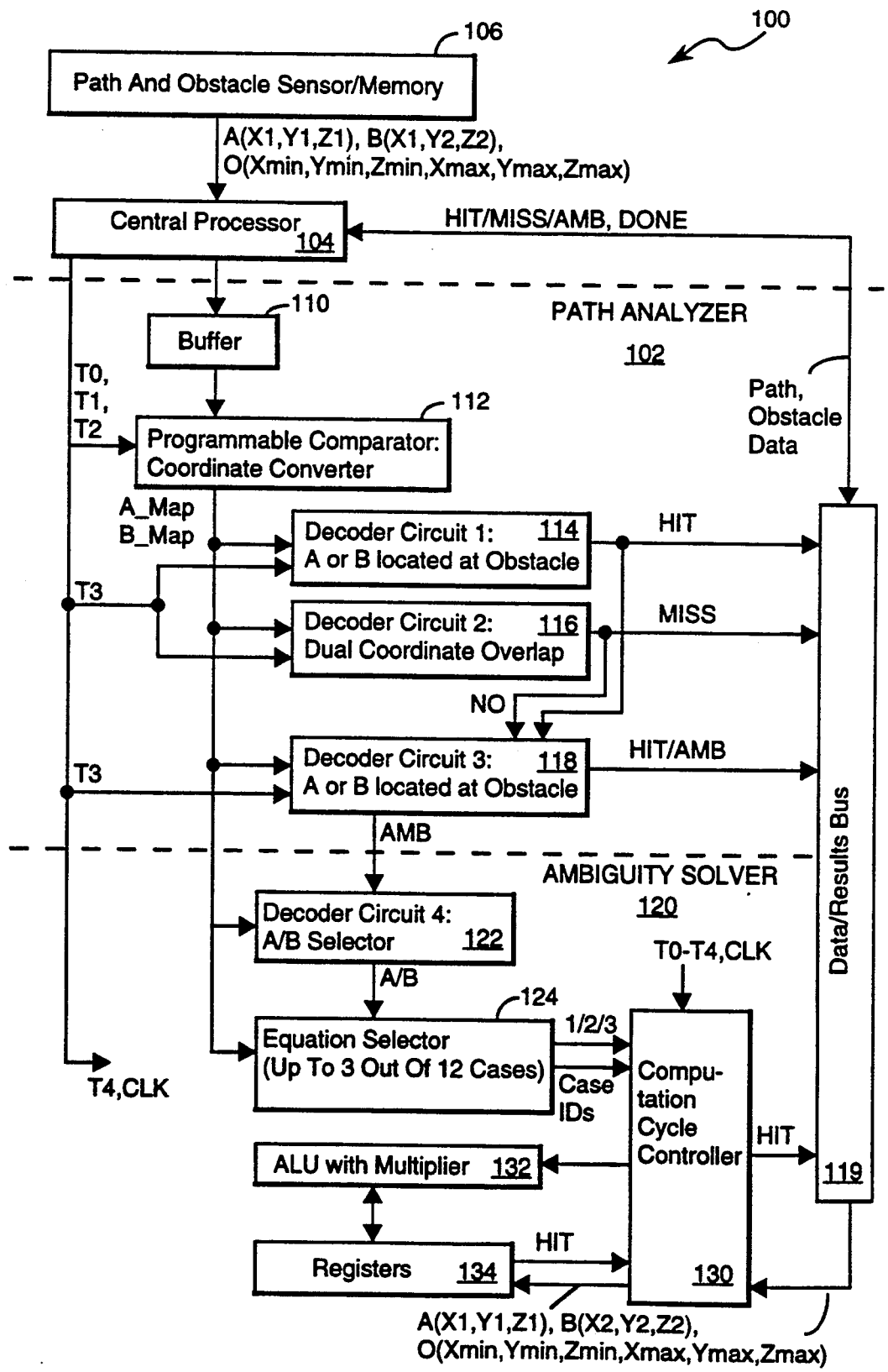

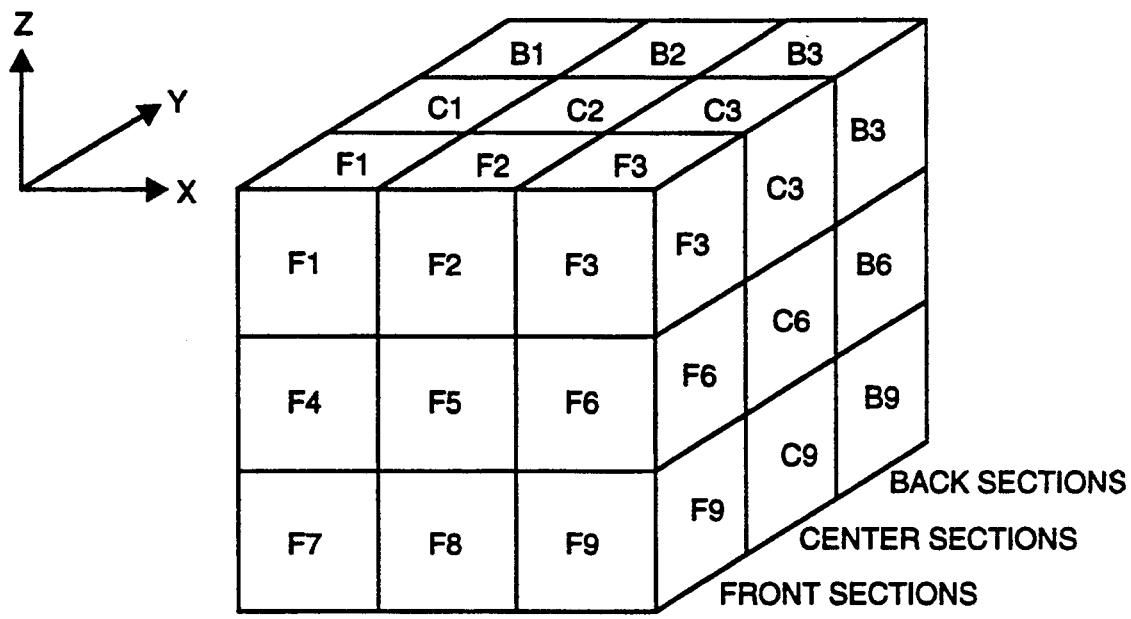
FIG_2
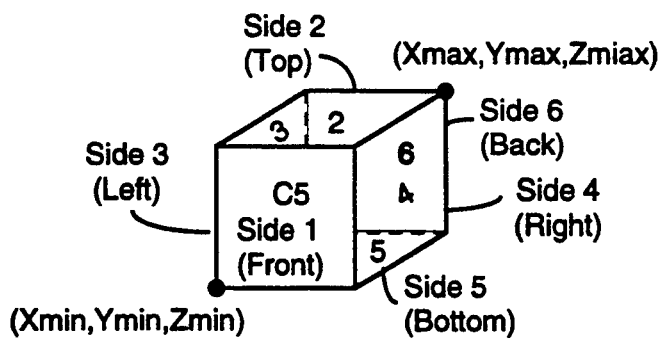
FIG_3
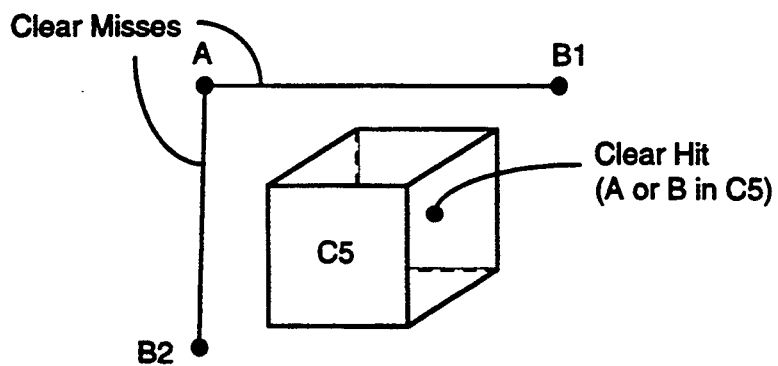
FIG_4

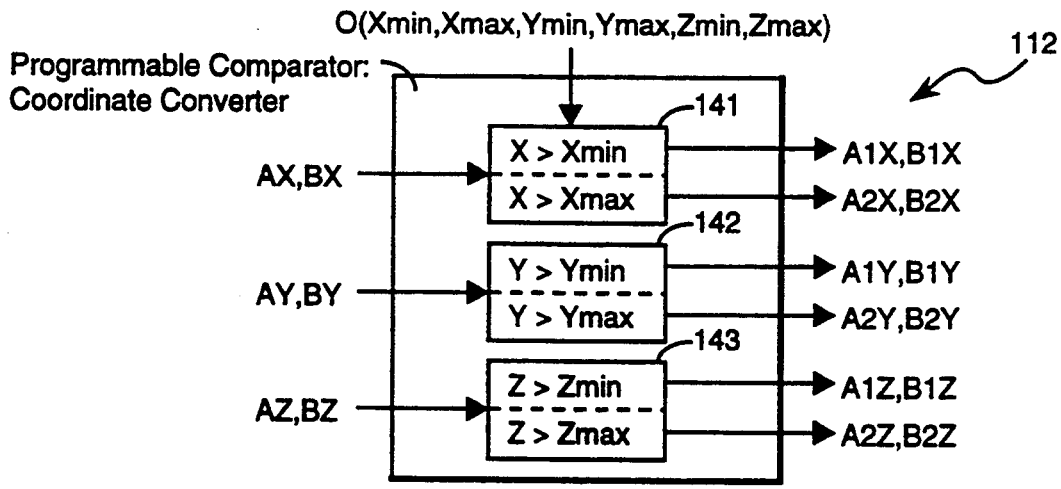
FIG_5
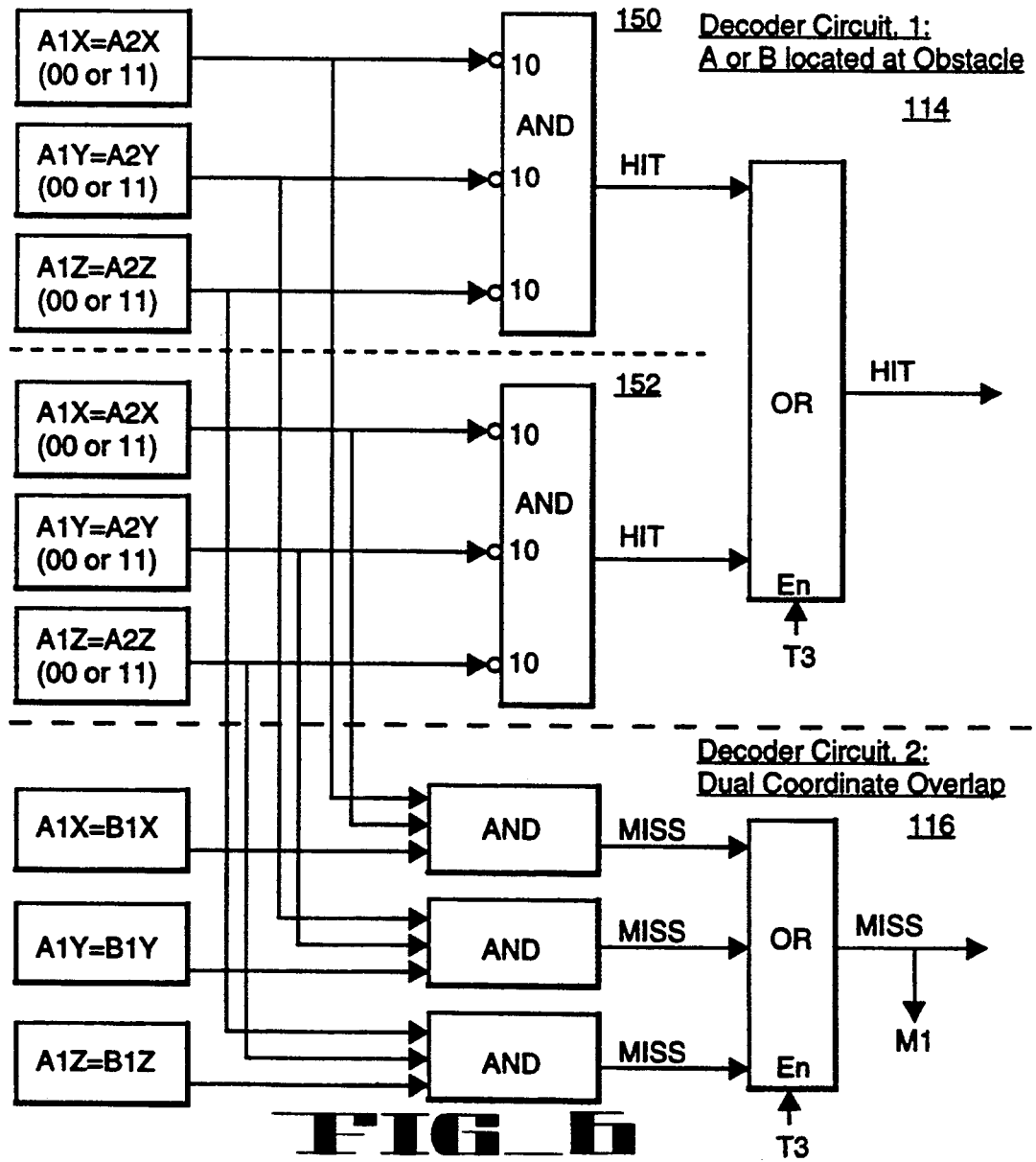
FIG_6

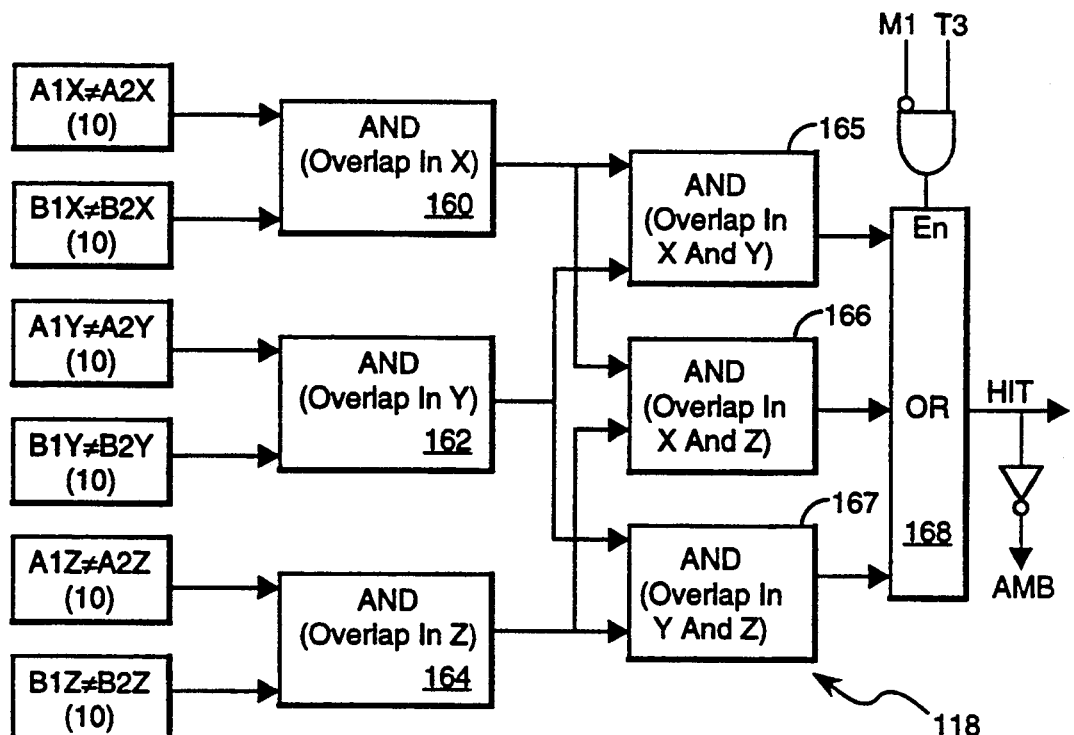
FIG_7
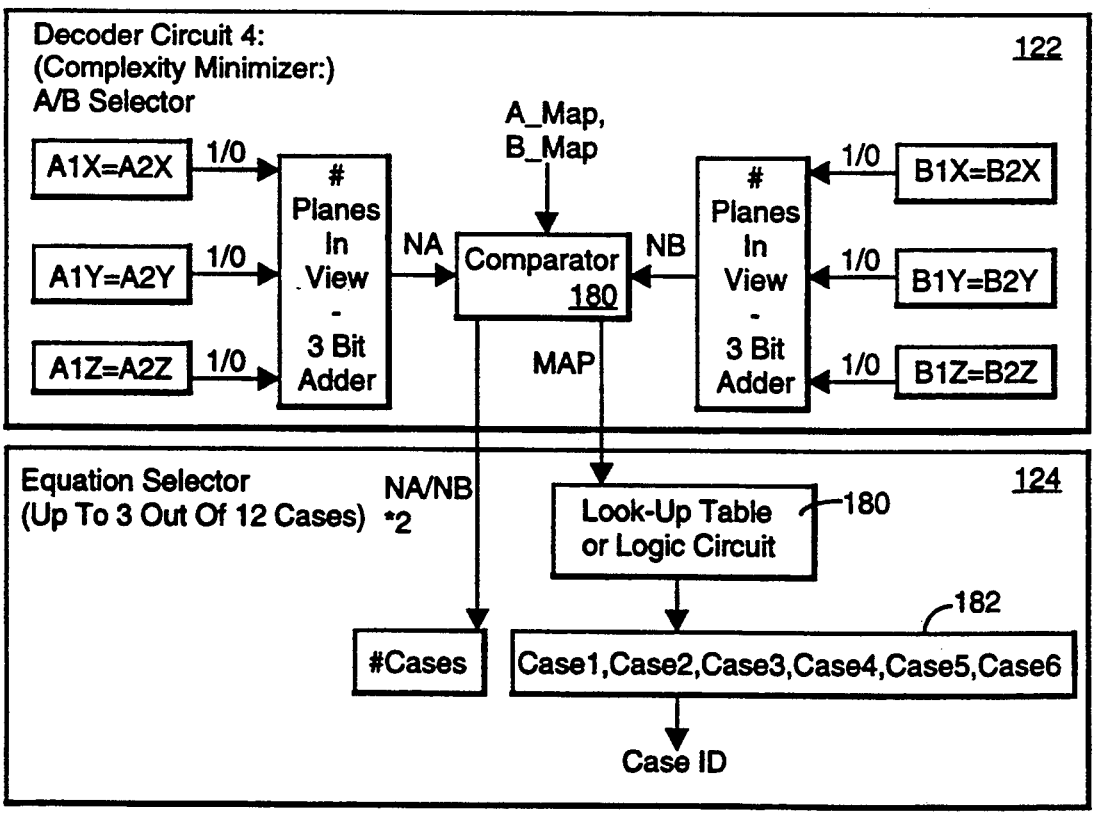
FIG_9

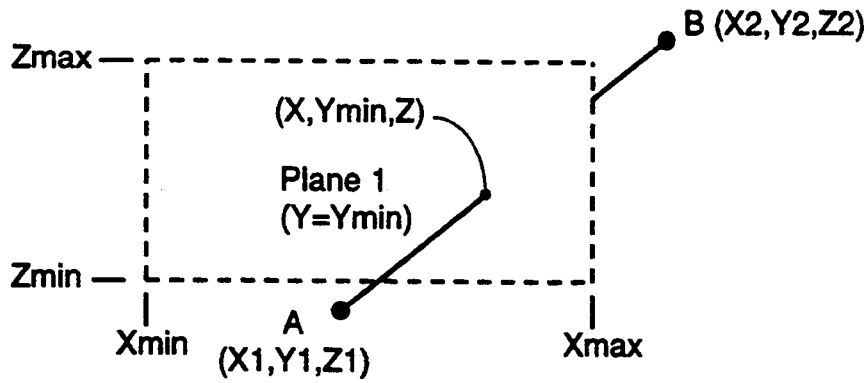
$X*DY = (Ymin-Y1)*DX + Y1*DY$
$Z*DY = (Ymin-Y1)*DZ + Z1*DY$
FIG_8
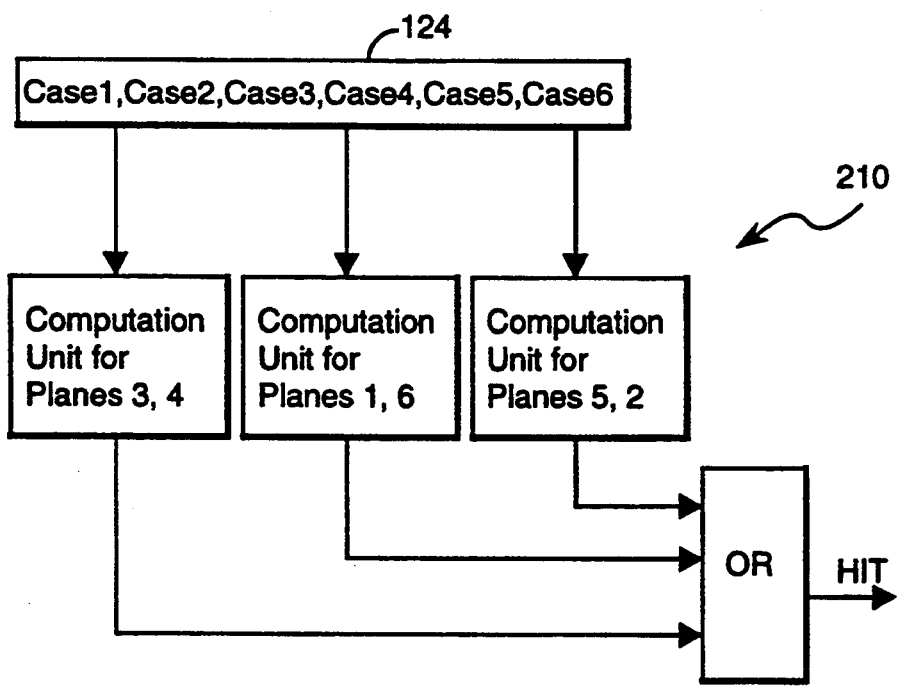
FIG_11

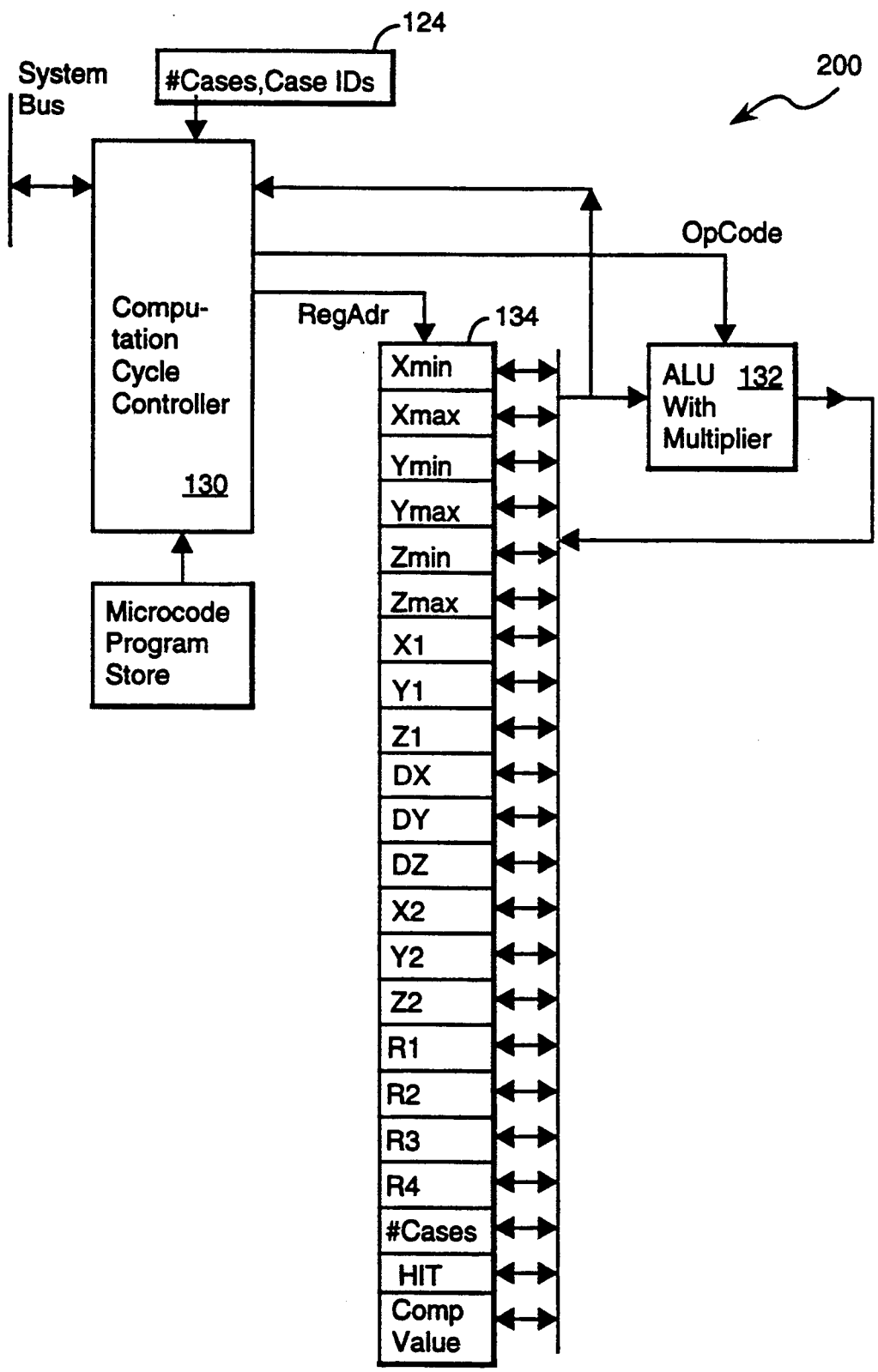
FIG_10

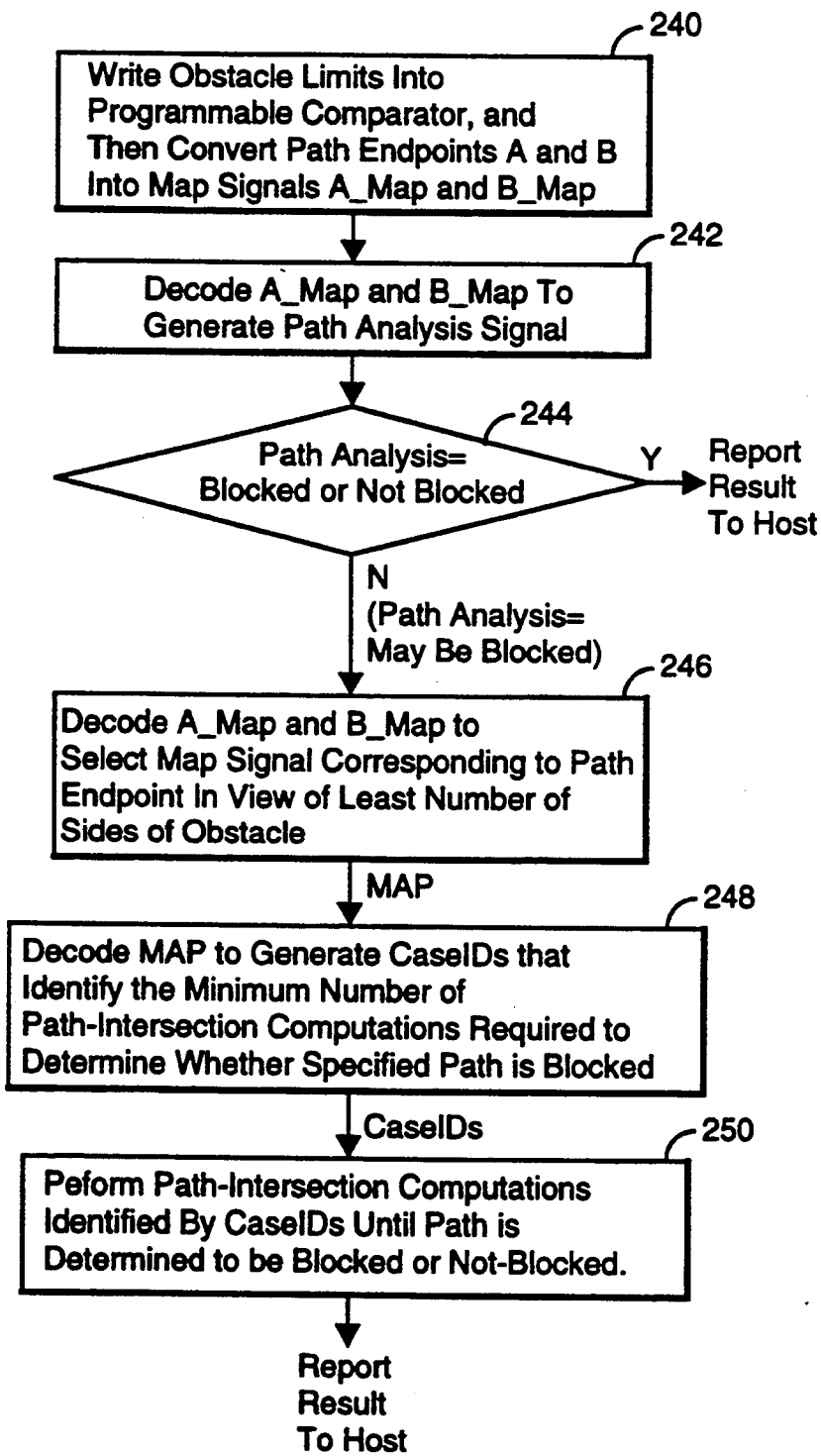
FIG_12

SYSTEM AND METHOD FOR COLLISION CHECKING BETWEEN SOLID OBJECTS AND VECTORS

The present invention relates generally to systems and methods for determining whether a specified path or line in space is intersected by a specified object, and particularly to systems for solving collision checking problems at very high speed.

BACKGROUND OF THE INVENTION

There are numerous circumstances in which it is useful to determine if a specified path is blocked by a specified obstacle. For example, in robotics, the system may need to find a clear path through a known terrain to a specified destination. This would apply equally well to a fixed position robot with a moveable arm as to a moveable robot. For instance, the outer boundary of a robot arm can be represented by a set of line segments representing the arm's "wire frame", and for any given arm position or future arm position intersection of any of those line segments with a known object indicates that movement of the robot arm to that position would cause a collision.

Other applications include checking an airplane's proposed trajectory against a known terrain and/or set of obstacles, and hidden ,line calculations for video display systems.

The present invention provides a fast solution to the question: does a given line in space intersect a given volume? Alternately, the invention can be used to generate a representation of the relationship between two points and a given volume, thereby providing data for selecting one of a number of possible subsequent calculations.

Path blockage analysis is usually accomplished using a general purpose a computer programmed to perform a series of mathematical calculations. In U.S. Pat. No. 4,764,873, dedicated hardware is used to analyze the relationship between a path and an obstacle by converting path and obstacle data into a form suitable for fast analysis and then performing a set of comparisons that sort the path into one of three classes: path obstructed (called a Hit), path clear (called a Miss), or path may be blocked (called Ambiguous). If the initial analysis is ambiguous, U.S. Pat. No. 4,764,873 teaches that the two dimensional path blockage problem can be resolved by performing slope comparison computations. However, for three dimensional path checking problems, the amount of computation required to resolve such ambiguities is considerable. In particular, the technique of the '873 patent to resolve ambiguities for a three-dimensional path is to evaluate a set of planes, of which contains an object edge and one of the two path end points. Then the second end point of the path is evaluated with respect to which side of this plane the point is situated. In the worst case, ambiguity resolution requires evaluation of one path point with respect to twelve planes, each evaluation requiring computation of the determinant of a $3 \times 3$ matrix. The sign of the resulting determinant indicates which side of a given plan the point in question is located. When the point has been evaluated with respect to all twelve planes, an additional set of logical conditions have to be tested in order to detect an intersection.

The present invention improves on U.S. Pat. No. 4,764,873 by providing an apparatus and method for minimizing the number of computations required to resolve three dimensional path blockage determinations that are not resolved by the first stage path analyzer hardware. One aspect of minimizing computations is to use an improved coordinate mapping (or labeling) method that facilitates identification of the minimum number of object planes that need to be checked for intersection by a specified line segment. The number of planes to be checked, using the present invention, in the worst case is three and in many cases the number of planes to be checked is one or two. Also, instead of requiring the computing of determinants, the present invention requires computation of no more than four relatively simple linear equations for each plane to be checked.

Furthermore, the present invention provides hardware implementations that can reduce computation time for even the worst case three dimensional path blockage determinations to something on the order of three microseconds when using a dedicated computational unit with a 40 MegaHertz clock rate and arithmetic circuitry capable of performing multiplications in a single clock cycle.

A very large percentage of paths can be conclusively determined to be a hit or a miss by the first stage hardware, thereby providing a path blockage determination in a time period on the order of four logic circuit gate delays. Using fast logic circuits, and a fully pipelined circuit architecture, the initial stage of path analysis can typically be completed in 50 nanoseconds (i.e., two clock cycles). The average path analysis computation time for a single path analyzer, using a dedicated computational unit to resolve ambiguities, is approximately 0.5 microseconds. By using several (e.g., eight) parallel path analyzer units, the average path analysis computation time can be reduced even further.

It is therefore a primary object of the present invention to provide a path blockage analysis system and method which performs three dimensional path analyses substantially faster than it would take a conventional computer to perform the same analysis.

Another object of the present invention is to provide a path blockage analysis system which simultaneously performs a set of predefined comparisons to determine the relationship between a specified path and a given obstacle.

SUMMARY OF THE INVENTION

In summary, the present invention is a path analyzer for determining if a specified path is blocked by a given obstacle in three dimensional space. A programmable comparator converts the path's first and second endpoints into first and second map signals, wherein each map signal indicates whether the corresponding path endpoint's position on predefined X, Y and Z coordinate axes is above, below or within a range of coordinate values associated with a specified obstacle. The specified obstacle is modelled as a rectangular parallelepiped having six sides, regardless of the actual shape of the obstacle. A first high speed decoder uses these map signals to make an initial determination as to whether the specified path is blocked, not blocked, or may be blocked by the specified obstacle.

Whenever the first decoder determines that the path may be blocked, a second level decoder determines the minimum number of additional computations needed to resolve whether the specified path is blocked. Depending on the number of sides of the specified obstacle that are "in view" of the specified path's endpoints, one to three pairs of path intersection computations are required. In the preferred embodiments a dedicated computational unit is used to perform the calculations specified by the decoder to resolve whether the specified path is blocked. The dedicated computation unit is preprogrammed to perform six different pairs of computations, corresponding to the six sides of the obstacle. Only the computations specified by the second level decoder are performed for any particular path blockage determination.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of a computer system incorporating the present invention.

FIG. 2 depicts the way three dimensional space is divided into twenty-seven sections for analyzing three dimensional paths, FIG. 3 shows the names assigned to the six sides of a three dimensional rectangular parallelepiped, which is used during path blockage determination to approximate a specified three dimensional obstacle.

FIG. 4 schematically depicts two paths representing cases of paths that clearly miss a specified obstacle, FIG. 5 is a block diagram of a programmable comparator used to encode a three dimensional path into two six-bit values.

FIG. 6 is a block diagram of two decoder circuits which detect paths having terminations overlapping a specified obstacle and paths which unambiguously miss the obstacle, FIG. 7 is a block diagram of a third decoder circuit which detects paths that pass directly though a specified obstacle, FIG. 8 is a block diagram of a fourth decoder circuit which determines the minimum number of computations required to analyze a specified path and also generates a set of identifiers corresponding to those computations.

FIG. 9 schematically depicts how the path analyzer determines whether a path intersects one particular side of an obstacle.

FIG. 10 is a block diagram of a dedicated computational unit for performing path intersection computations.

FIG. 11 is a block diagram of a set of three parallel computational units for performing parallel path intersection computations.

FIG. 12 is a flow chart of the method of the present invention.

DESCRIPTION OF THE PREFERRED EMBODIMENT

Referring to FIG. 1, there is shown a computer system 100 incorporating a path analyzer 102 in accordance with the present invention. For the purposes of this description, it will be assumed that the computer system 100 is mounted on or working on behalf of a moving vehicle, such as an airplane, robot or space vehicle, and that the computer system 100 is being used to avoid collisions with known or detected obstacles. Thus, the computer system 100 is used to determine whether specified three dimensional paths intersect sections of space known to be occupied by obstacles.

The computer system 100 has a central processor (CPU) 104 which is programmed to perform various tasks. As will be described in detail, the path analyzer 102 is used by the CPU 104 as a co-processor, much in the same way as math co-processors are used in many computer systems. The CPU 104 controls operation of the path analyzer 102 using a set of control signals, herein labelled T0, T1, T2, T3, T4 and a 40 Megahertz clock signal labelled CLK. In one preferred embodiment, the host computer 100 uses eight parallel path analyzers 102 (not shown)in order to process eight obstacles at a time.

The computer system 100 also includes a memory or other peripheral equipment 106 for specifying or representing the paths and obstacles to be analyzed. Typically, the obstacles will be specified by a map (stored in the computer's memory or on a storage medium such as a magnetic disk) covering the relevant terrain, or by a database of known obstacles, and the paths will be specified by the task that the computer system 100 is programmed to perform. Thus the peripheral 106 will typically be a memory device. However, the path and obstacle data could come from optical or other sensors.

The CPU 104 downloads into the path analyzer 102, via buffer 110, data representing the end points of a specified path as well as data corresponding to the coordinates of a specified obstacle. Buffer 110 preferably includes high speed FIFO buffering circuitry for loading new obstacle data into the path analyzer 102 as soon as the path analyzer 102 completes the previous path analysis, thereby facilitating comparison of a specified path with a large set of known or observed obstacles.

Programmable comparator 112 compares the end points of a specified path with data corresponding to the coordinates of a specified obstacle. The operation of the programmable comparator is described in detail below with reference to FIGS. 2–5. The programmable comparator 112 generates two map signals A_Map and B_Map, each consisting of three two-bit values, which are then decoded by three decoders 114, 116 and 118 to produce an initial path analysis signal that indicates whether the obstacle blocks the specified path. The initial path analysis signal has a value of HIT if the specified path intersects the specified obstacle, a value of MISS if the path does not intersect the obstacle, and AMB if first three decoders were unable to conclusively determine whether or not the path is blocked. The output signals generated by these decoders are transmitted back to the CPU 104 by bus 119.

As will be explained in more detail below, the first stage of the path analyzer 102 will produce ambiguous results in approximately 39% of the time, given a random distribution of line segments and obstacles. That is, in some circumstances the initial path analysis signal will indicate that the path may or may not be blocked. The second stage of the path analyzer, herein called the ambiguity resolver 120, includes a decoder circuit 122 and equation selector 124 that together determine the minimum number of computations that need to be performed to determine if a specified path is blocked by a specified obstacle.

In one embodiment, the path analyzer 102 includes a dedicated path intersection computational unit, consisting of a micro-controller 130, arithmetic logic unit with multiplier 132, and a set of high speed data registers 134. The intersection computational unit performs the calculations needed to resolve ambiguous path analyses much faster than a general purpose central processor.

Representing Position of Path and Obstacles In 3D Space

Referring to FIGS. 2 and 3, for the purpose of analyzing a path, all of three dimensional space is divided into twenty-seven sections, herein labelled F1-F9 (for the front nine sections), C1-C9 (for the center nine sections) and B1-B9 (for the back nine sections). Section C5 is a rectangular parallelepiped (i.e., a rectangular three dimensional box-shaped solid region) that totally encloses a specified object, and is bounded in the X, Y and Z directions by the minimum and maximum X, Y, and Z coordinates of the object (Xmin, Ymin, Zmin) and (Xmax, Ymax, Zmax). Since FIG. 2 represents all of space, the surrounding regions actually extend infinitely in directions facing away from section C5. For instance, region F3 is actually unbounded in the +X, −Y and +Z directions. In the preferred embodiment, the assigned sixteen bit value for "infinity" on any axis is $2^{16}-1$.

For the purposes of explaining the operation of the path analyzer's circuitry, the six surfaces of region C5 are labelled as Sides 1-6, as indicated in FIG. 3.

FIG. 4 shows examples of two paths A-B1 and A-B2 which clearly miss the obstacle represented by C5. While this is clear to the human eye, the mason these paths can quickly be analyzed as clear misses by the path analyzer 102 is as follows. Whenever both endpoints of a line are found in a layer of nine sections (such as the layer of Front sections F1-F9 or the top layer of sections F1-F3, C1-C3, B1-B3) outside section C5, the path cannot intersect obstacle C5. In the case of path A-B1, both endpoints of the path have Z coordinate values above Zmax (both points are found in the layer of sections above section C5) and thus the path is not blocked. Both endpoints of path A-B2 are found in the set of nine sections to the left of section C5, because both points have an X coordinate less than Xmin, and thus that path is also not blocked.

If either endpoint of a path is located inside section C5, the path is considered to be blocked. Referring back to FIG. 2, other examples of paths that are definitely blocked are paths having one endpoint each in sections F5 and B5, or sections C4 and C6, or sections C2 and C8. On the other hand a path having endpoints in sections F3 and C4 may or may not be blocked, depending on the exact location of the path's endpoints. Given a random distribution of A and B, it can be seen that the set of possible AB paths can be categorized into three subsets: definitely unblocked, definitely blocked, and may be blocked.

The present invention analyzes paths using a set of mathematical comparisons corresponding to the regions shown in FIG. 2, so that any path can be categorized as unblocked, blocked, or may be blocked. These region based mathematical comparisons are also used to select the minimum set of computations needed to resolve paths that are not conclusively analyzed by the first stage of the path analyzer 102. Note that this computation selection is made possible by the signal mapping and labelling system of the present invention, which facilitates easy identification of the object's planes that are "in view" of a line segment's end points.

Programmable Comparator

As shown in FIG. 5, the programmable comparator 112 used to encode the path endpoints A and B is functionally a set of three programmable comparators 141-143, implemented in the preferred embodiment with three WAM (window addressable memory) circuits. Each programmable comparator is preferably the Associative Comparator made by IBM or the VHSIC Window Addressable Memory (part number 1HC31) made by TRW. Regardless of the component or components used, the programmable comparators must be able to test coordinate values (such as the X coordinate of a point in space) against two or more value ranges so as to generate the A and B map signals.

In the preferred embodiment, for a three dimensional path, the X, Y and Z coordinates of the path's starting point A and ending point B are each tested to see if it is (1) greater than the minimum value of that coordinate for the obstacle, and (2) greater than the maximum value of that coordinate for the obstacle.

Thus the X coordinate X1 of point A is tested to see if it is greater than $X_{min}$ and $X_{max}$. Depending on the value of X1, the X portion of A_Map (A1X, A2X) is as follows:

| Value of X1 | A Map |
| --- | --- |
| less than Xmin | 00 |
| between Xmin and Xmax | 10 |
| greater than Xmax | 11 |

Thus a six-bit binary map signal is generated for each point A and B, and these are called the A_Map and B_Map. Each map signal identifies the position of the corresponding point A or B in terms of the twenty-seven space sections shown in FIG. 2. For instance, a map signal value of 101010 corresponds to space section C5, while a value of 000000 corresponds to space section F7 and a value of 111111 corresponds to space section B3. Thus, while a arbitrary six bit b! nary value could potentially have sixty-four different values, each map signal can have only twenty-seven ($3^3$) different values, because there are only twenty-seven distinct sections of space insofar as the present invention is concerned. The twenty-seven sections of space am labelled as shown FIG. 2 and as listed in Table 1. Note that map signal for a coordinate is never equal to "01", which greatly simplifies the design of the path analyzer's decoder circuits.

TABLE 1

| Section | Map Value | Section | Map Value | Section | Map Value |
| --- | --- | --- | --- | --- | --- |
| F1 | 000011 | C1 | 001011 | B1 | 001111 |
| F2 | 100011 | C2 | 101011 | B2 | 101111 |
| F3 | 110011 | C3 | 111011 | B3 | 111111 |
| F4 | 000010 | C4 | 001010 | B4 | 001110 |
| F5 | 100010 | C5 | 101010 | B5 | 101110 |
| F6 | 110010 | C6 | 111010 | B6 | 111110 |
| F7 | 000000 | C7 | 001000 | B7 | 001100 |
| F8 | 100000 | C8 | 101000 | B8 | 101100 |
| F9 | 110000 | C9 | 111000 | B9 | 111100 |

Referring to FIG. 1, the programmable comparator 112 is used by first programming the comparators or "windows" with values corresponding to the minimum and maximum values of each coordinate for the specified obstacle. Then, in two successive steps, point A is tested and then point B is tested. In other words, the X, Y and Z coordinates for point A are simultaneously processed in one step, and then coordinates for point B are processed in a second step. Thus, once the programmable comparator 112 is programmed with the data for a particular obstacle, it takes only two 25 nanosecond "cycles" (initiated by timing signals T1 and T2) to process both end points of a path. In the preferred embodiment, it takes two 25 nanosecond cycles (initiated by timing signal T0) to program the comparator 112 and another two 25 nanosecond cycles to generate the map signals for the two path endpoints, for a worst case total of 100 nanoseconds that is applicable only for moving obstacles. Typically, for a stationary object, many line segments will be tested against a single object, and therefore mapping of each path takes just 50 nanoseconds.

First Stage Decoders

In FIG. 6, decoder 114 uses two logic circuits 150 and 152 to determine whether A_Map or B_Map equal "101010", in which case at least one of the path endpoints A or B are located within the same space section C5 as the obstacle, and therefore the specified path intercepts the specified obstacle. The results from logic circuits 150 and 152 are combined by OR gate 154 and transmitted back to the CPU 104 via bus 119. An interception of the path by the obstacle is called a "HIT" in the Figures.

Decoder 116 is a logic circuit which detects when both path endpoints are in space sections above, below, right, left, in front or in back of the obstacle, thereby indicating that the path definitely does not intersect the specified obstacle, called a "MISS" in the Figures. For instance, if both path endpoints A and B have Z-coordinate map signals equal to "11", that indicates that the specified path is above the obstacle, as shown by path A-B1 in FIG. 4. If both path signals have X-coordinate map signals equal to "00", that indicates that the specified path is to the left of the obstacle, as shown by path A-B2 in FIG. 4.

Decoder 118, shown in FIG. 7, is operative only if decoder 116 does not find a MISS, and works as follows. AND gate 160 outputs a TRUE value only if A_Map and B_Map both have X values of "10". Similarly, AND gate 162 outputs a TRUE value if A_MAP and B_Map both have Y values of "10", and AND gate 164 outputs a TRUE value if A_MAP and B_Map both have Z values of "10". If any two of the logic signals from gates 160, 162 and 164 are TRUE, as determined by AND gates 165, 166, 167 and OR gate 168, and decoder 116 did not output a value of MISS, then decoder 118 outputs a HIT signal indicating that the specified path goes directly through the obstacle. When decoder 118 outputs a HIT signal, the path is intersected by the obstacle because endpoints A and B are located in sections F5 and B5, or sections C4 and C6, or sections C2 and C8—i.e., in opposing sections directly facing the sides of the obstacle's section C5. Note that OR gate 168 is enabled only during time period T3 when decoder 116 has not output a value of MISS.

If decoder 118 is enabled and does not output a HIT signal, then the first stage decoders were unable to conclusively determine that the path A-B does or does not intercept the specified obstacle. Thus, the result of the first stage decoders is ambiguous, as indicated by the AMB signal shown in FIGS. 1 and 7, meaning that the path may or may not be blocked by the obstacle.

The outputs from the first stage decoders 114, 116 and 118 are read by the CPU 104 after timing signal T3 enables the output circuits of these decoders. If any of these decoders generates a HIT or MISS signal at time T3, the CPU 104 receives that signal and processing of the specified path and obstacle pair is completed. If these decoders do not generate a HIT or MISS signal, it is necessary to invoke the ambiguity solver circuit 120.

The decoders in the first stage of the path analyzer 102, using very fast circuitry with 2 nanosecond gate delays, can produce a HIT, MISS, or AMB output in about 20 to 25 nanoseconds. Using more conventional circuitry, the decoders will take about 50 nanoseconds to generate valid output signals. Since the decoding of one path is performed while the next path to be analyzed is mapped by comparator 112 (i.e., the first stage is pipelined), the first stage of the path analyzer 102 completes its operation, including conversion of the path coordinates into Map signals and decoding the map signals, in 50 nanoseconds per line segment. Given a random distribution of path endpoints and obstacle positions, it can be shown that approximately 61% of all three-dimensional paths will, on average, be conclusively determined to be a hit or miss by the first stage of the path analyzer.

Ambiguity Solver Circuit

Referring to FIGS. 2 and 3, the operation of the ambiguity solver circuit 120 is premised on the following observations regarding the number of sides of section C5 that are "visible" from any of the other sections. Them are three types of sections, in terms of their perspective when looking at center section C5: face sections from which only one side of center section C5 is visible, edge sections from which two sides of C5 are visible, and vertex sections from which three sides of C5 are visible. The distribution of these types of sections is as follows:

VERTEX: F1, F3, F7, F9, B1, B3, B7, B9
EDGE: F2, F2, F4, F6, F8, C1, C3, C7, C9, B2, B4, B6, B8
FACE: F5, B5, C4, C6, C2, C8

For example, referring to FIG. 8, from any point in "face" section F5, only Side 1 of section C5 is visible. As a result, when determining whether or not a specified path A-B is blocked by the obstacle O, if path endpoint A is in section F5, the only computation that needs to be done is to determine .whether the path intersects Side 1 of section C5. Since Side 1 is characterized by Y=Ymin, the path blockage problem can be solved by computing the values of X and Z for path A-B at Y=Ymin:

$$X = \frac{(Ymin - Y1)}{DY} DX + X1$$

$$Z = \frac{(Ymin - Y1)}{DY} DZ + Z1$$

where $DX = X2 - X1$, $DY = Y2 - Y1$ and $DZ = Z2 - Z1$, and then testing to see if X is between Xmin and Xmax and testing to see if Z is between Zmin and Zmax. If so, the path is blocked by the obstacle, and otherwise the path is not blocked.

Since we are only interested in whether or not the path is blocked, the above equations are rewritten as follows to avoid performing a division operation:

$$X \bullet DY = (Ymin - Y1)DX + X1 \bullet DY$$

$$Z \bullet DY = (Ymin - Y1)DZ + Z1 \bullet DY$$

Then X•DY is compared with Xmin•DY and Xmax•DY, and Z•DY is compared with Zmin•DY and Zmax•DY. By using only multiplication, addition and comparison operations, the path analysis is performed much more efficiently than if division operations were performed.

Note that path A-B can be evaluated with the above pair of equations regardless of where point B is located. Thus, if point A is in a face section and point B is in a vertex section, the path blockage problem can be solved using just one pair of equations if point A is used as the starting point of the analysis.

More generally, the number of pairs of line-through-plane intersection equations which need to be computed is equal to the number of sides that are in view from the selected path endpoint. Thus, if point A is in a vertex section (from which three sides of C5 are in view) and point B is in an edge section (from which two sides of C5 are in view), it would be better to take the perspective of point B, since then only two pairs of line equations need to be solved, rather than three (which would be the case if the perspective of line A were taken as the analysis point).

Referring to FIG. 9, decoder circuit 122 determines the number of sides of section C5 visible to points A and B as follows. In general, the number of sides of center section C5 which are visible from a particular point A is equal to the number of coordinates in point A's map signal A_Map which are equal to 00 or 11 (i.e., which are not equal to 10). For instance, all three coordinates (X,Y and Z) of the map value 000000 section are unequal to "10", and therefore three planes of section C5 are visible to this point (which is located in vertex F7). On the other, any point in face section F5 has a map value of 100010, with just the Y coordinate having a value unequal to "10", and therefore only one plane (Plane 1) of section C5 is visible.

Using this scheme, decoder circuit 122 generates two values NA and NB which are equal to the number of planes of section C5 visible from points A and B. Comparator 180 outputs a map signal MAP which is equal to the map signal of the point (A or B) which is in a sector with the least number of planes of C5 in view. If NA and NB are equal, path endpoint A and NA are selected by the decoder circuit 122.

Decoder circuit 124 is essentially a look-up table, which can be implemented either using a read only memory or a hardwired logic circuit 180, that generates a set of "case identifiers" that indicate the computations required to determine whether the specified path is blocked by the specified obstacle. The input to the decoder circuit 124 is the MAP signal from decoder 122 and the output is a set of six case IDs stored in a shift register 182. As explained below, the selected map signal is the one corresponding to the path endpoint from which the least number of the obstacle's sides are visible, because a pair of line intersection computations must be performed for each obstacle side that is visible.

Table 2 lists twelve equations that cover all possible cases of the computations that would be required in order to determine whether a specified path is blocked by an obstacle. Each equation is assigned a case identifier between 1 and 12. Note that the equations have been written in a form that includes no division operations, and instead includes only multiplication operations because multiplication operations can be performed much faster than divisions. Table 2 also lists the two comparison tests (i.e., coordinate value inequality relationships) for each equation that are both satisfied only when the specified path is blocked.

It is also very important to note that the 12 equations in Table 2 are actually used in pairs. For instance to determine whether a specified path intersects Side 2 of section C5, the system uses the pair of equations identified here as Cases 11 and 12. To determine that the specified path actually intersects a particular side of section C5, all four comparison tests for the corresponding pair of equations must be satisfied. If any of the four inequality relationships is not True, then the specified line is not blocked by that side of the obstacle. Thus, for instance, if the first test fails, all subsequent tests are dropped.

Table 3 shows how the case IDs for two, four or six computations are selected based on the values of the selected MAP signal. Note that in Table 3 the symbol "NA" means that a particular portion of the map signal value is not applicable, or irrelevant.

Table 4 shows the case ID values generated by decoder 124 for each possible input MAP value. Note that an input MAP signal value of "101010" is an illegal input to decoder 124 because that MAP value is associated with a path endpoint that is inside the obstacle, which would be detected by the first stage decoder circuitry and flagged as a HIT. Also, in Table 4, when the number of computations to be performed is less than six, the trailing case ID values output by the decoder are all zeros, indicating that no additional computations need to be performed.

TABLE 2

| CASE | SIDE | FUNCTION | |
|---|---|---|---|
| 1 | 3 | Compute: | $Y*DX = (Xmin-X1)*DY + Y1*DX$ |
|   |   | Test: | $Ymin*DX < Y*DX < Ymax*DX$ |
| 2 | 3 | Compute: | $Z*DX = (Xmin-X1)*DZ + Z1*DX$ |
|   |   | Test: | $Zmin*DX < Z*DX < Zmax*DX$ |
| 3 | 4 | Compute: | $Y*DX = (Xmax-X1)*DY + Y1*DX$ |
|   |   | Test: | $Ymin*DX < Y*DX < Ymax*DX$ |
| 4 | 4 | Compute: | $Z*DX = (Xmax-X1)*DZ + Z1*DX$ |
|   |   | Test: | $Zmin*DX < Z*DX < Zmax*DX$ |
| 5 | 1 | Compute: | $X*DY = (Ymin-Y1)*DX + X1*DY$ |
|   |   | Test: | $Xmin*DY < X*DY < Xmax*DY$ |
| 6 | 1 | Compute: | $Z*DY = (Ymin-Y1)*DZ + Z1*DY$ |
|   |   | Test: | $Zmin*DY < Z*DY < Zmax*DY$ |
| 7 | 6 | Compute: | $X*DY = (Ymax-Y1)*DX + X1*DY$ |
|   |   | Test: | $Xmin*DY < X*DY < Xmax*DY$ |
| 8 | 6 | Compute: | $Z*DY = (Ymax-Y1)*DZ + Z1*DY$ |
|   |   | Test: | $Zmin*DY < Z*DY < Zmax*DY$ |
| 9 | 5 | Compute: | $X*DZ = (Zmin-Z1)*DX + X1*DZ$ |
|   |   | Test: | $Xmin*DZ < X*DZ < Xmax*DZ$ |
| 10 | 5 | Compute: | $Y*DZ = (Zmin-Z1)*DY + Y1*DZ$ |
|   |   | Test: | $Ymin*DZ < Y*DZ < Ymax*DZ$ |
| 11 | 2 | Compute | $X*DZ = (Zmax-Z1)*DX + X1*DZ$ |
|   |   | Test: | $Ymin*DZ < X*DZ < Xmax*DZ$ |
| 12 | 2 | Compute: | $Y*DZ = (Zmax-Z1)*DY + Y1*DZ$ |
|   |   | Test: | $Ymin*DZ < Y*DZ < Ymax*DZ$ |

TABLE 3

Computation Selections Based on Map Values

| MAP VALUE | | | | |
|---|---|---|---|---|
| X-Map | Y-Map | Z-map | CASE | SIDE |
| 00 | NA | NA | 1 | 3 |
|    |    |    | 2 | 3 |
| 11 | NA | NA | 3 | 4 |
|    |    |    | 4 | 4 |
| NA | 00 | NA | 5 | 1 |
|    |    |    | 6 | 1 |
| NA | 11 | NA | 7 | 6 |
|    |    |    | 8 | 6 |
| NA | NA | 00 | 9 | 5 |
|    |    |    | 10 | 5 |
| NA | NA | 11 | 11 | 2 |
|    |    |    | 12 | 2 |

Referring to FIG. 10, in a first preferred embodiment the computations required to resolve the path blockage problem, when the first stage decoders are unable to provide a definite HIT or MISS result, are preformed by a dedicated computational unit 200. The dedicated computation unit 200 is microprogrammed to perform the computations corresponding to the case IDs generated by decoder 124 using a set of registers 134 for storing data and a high speed arithmetic logic unit (ALU) 132. In the preferred embodiment, ALU 132 includes a high speed multiplier accumulator (MAC) chip (such as the VHSIC Multiplier Accumulator Chip, part number 1H037, made by TRW) and a comparator. In the preferred embodiment, the ALU 132 can multiply two sixteen bit values in one 25 nanosecond clock cycle.

TABLE 4

Look-Up Table 182

| MAP VALUE | | | CASE IDs | | | | | |
|---|---|---|---|---|---|---|---|---|
| X-Map | Y-Map | Z-map | | | | | | |
| 00 | 00 | 00 | 1 | 2 | 5 | 6 | 9 | 10 |
| 00 | 00 | 10 | 1 | 2 | 5 | 6 | 0 | 0 |
| 00 | 00 | 11 | 1 | 2 | 5 | 6 | 11 | 12 |
| 00 | 10 | 00 | 1 | 2 | 9 | 10 | 0 | 0 |
| 00 | 10 | 10 | 1 | 2 | 0 | 0 | 0 | 0 |
| 00 | 10 | 11 | 1 | 2 | 11 | 12 | 0 | 0 |
| 00 | 11 | 00 | 1 | 2 | 7 | 8 | 9 | 10 |
| 00 | 11 | 10 | 1 | 2 | 7 | 8 | 0 | 0 |
| 00 | 11 | 11 | 1 | 2 | 7 | 8 | 11 | 12 |
| 11 | 00 | 00 | 3 | 4 | 5 | 6 | 9 | 10 |
| 11 | 00 | 10 | 3 | 4 | 5 | 6 | 0 | 0 |
| 11 | 00 | 11 | 3 | 4 | 5 | 6 | 11 | 12 |
| 11 | 10 | 00 | 3 | 4 | 9 | 10 | 0 | 0 |
| 11 | 10 | 10 | 3 | 4 | 0 | 0 | 0 | 0 |
| 11 | 10 | 11 | 3 | 4 | 11 | 12 | 0 | 0 |
| 11 | 11 | 00 | 3 | 4 | 7 | 8 | 9 | 10 |
| 11 | 11 | 10 | 3 | 4 | 7 | 8 | 0 | 0 |
| 11 | 11 | 11 | 3 | 4 | 7 | 8 | 11 | 12 |
| 10 | 00 | 00 | 5 | 6 | 9 | 10 | 0 | 0 |
| 10 | 00 | 10 | 5 | 6 | 0 | 0 | 0 | 0 |
| 10 | 00 | 11 | 5 | 6 | 11 | 12 | 0 | 0 |
| 10 | 10 | 00 | 9 | 10 | 0 | 0 | 0 | 0 |
| 10 | 10 | 10 | 0 | 0 | 0 | 0 | 0 | 0 |
| 10 | 10 | 11 | 11 | 12 | 0 | 0 | 0 | 0 |
| 10 | 11 | 00 | 7 | 8 | 9 | 10 | 0 | 0 |
| 10 | 11 | 10 | 7 | 8 | 0 | 0 | 0 | 0 |
| 10 | 11 | 11 | 7 | 8 | 11 | 12 | 0 | 0 |

Table 5 lists the instructions executed by the computational unit 200 for (1) clearing the registers, then loading the endpoint coordinates and obstacle coordinates into the registers 134 and computing the DX, DY and DZ values; and (2) performing a typical single one of the line intersection computations.

TABLE 5

| #CPU Cycles | Description |
|---|---|
| INITIALIZATION: | |
| 2 | Load into registers: X1,Y1,Z1,X2,Y2,Z2 (use 48 bit bus) |
| 2 | Load into registers: Xmin,Ymin,Zmin, Xmax,Ymax,Zmax |
| 6 | Compute DX,DY,DZ (only when ambiguity is detected) |
| 10 | Subtotal for Initialization |
| CONTROL CYCLE ROUTINE: | |
| Loop Until #Cases=0: | |
| 1 | Read First Case ID for a Particular Side |
| 1 | Call Computation Routine for Case ID |
| 1 | Test Return value |
| 2 | If Return value is MISS and #Cases=1 Return(MISS) to main CPU. If Return Value is MISS and #Cases>1 |

TABLE 5-continued

| #CPU Cycles | Description |
|---|---|
| | Read next Case ID, decrement #Cases, and skip to end of Loop (skips one computation) Else continue (return value was HIT): |
| 1* | Read Second Case ID for the Side |
| 1* | Call Computation Routine for Case ID |
| 1* | Test Return value |
| 1 | If Return value is MISS and #Cases=0 Return(MISS) to main CPU. |
| 1 | If Return value is HIT Return(HIT) to main CPU. |
| 10 | Subtotal |
| −3* | Instructions not used if pairs of computation routines are combined to avoid extra control steps |
| 7 | Revised subtotal |
| TYPICAL SINGLE COMPUTATION (Case 1): | |
| 2 | ACC = Xmin-X1  --ACC is accumulator in ALU-- |
| 1 | ACC = ACC * DY |
| 1 | R1 = ACC       --R1 is a register-- |
| 2 | ACC = Y1 * DX |
| 1 | ACC = ACC + R1 |
| 1 | R1 = ACC |
| 2 | ACC = Ymin * DX |
| 1 | Compare: ACC with R1 |
| 1 | Return (MISS) if ACC − R1 ≦ 0 |
| 1 | ACC = Ymax * DX |
| 1 | Return (MISS) if R1 − ACC ≦ 0 |
| 1 | Return (HIT) |
| 12, 14, or 15 | Subtotal—depending on outcome of computation |

Using a 40 Megahertz clock rate, or 25 nanoseconds per clock cycle, the 10 cycles for initializing the computational unit takes 250 nanoseconds. Note that the first two initialization steps (loading data into the unit's registers via a 48 bit data bus) can overlap processing by the first stage of the path analyzer.

Using a single computation unit to perform the two to six line intersection computations, Table 5 shows that it takes twelve to fifteen clock cycles to perform each individual computation routine, or 300 to 375 nanoseconds. The length of the computations is variable because each pair of computations may be terminated early if the result of any comparison test is False.

The control cycle routine adds about 7 CPU cycles for each pair of computations. Note that two computations are required to determine that a line intersects any of the sides of the obstacle. However, if the first computation determines that there isn't a hit, the second computation for that side need not be performed. On average, therefore, 1.5 computations are performed. The control cycle routine stops performing computations and returns a value to the main CPU 104 whenever (A) a HIT is found, or (B) all computations are done and no HIT has been found, indicating that the specified path is not blocked by the obstacle.

In the worst case, all six computations would have to be performed, with a total computation time of 10 CPU cycles for initialization, 21 CPU cycles for computation cycle control, and 90 CPU cycles for running six computation routines, for a grand total of 121 CPU cycles or 3.025 microseconds using a 40 Megahertz clock rate. Only a small fraction (approximately 1.1 percent) of analyzed paths would take this much time to analyze given a random distribution of path endpoints and obstacle positions, and thus the average computation time will be much lower.

The average path analysis computation time for a single path analyzer, using a dedicated computational unit as shown in FIG. 10 to resolve ambiguities, is approximately 0.5 microseconds. By using several (e.g., eight) parallel path analyzer units, the average path analysis computation time can be reduced even further.

Dedicated Intersection Computation with Parallel Circuits

Referring to FIG. 11, in a second preferred embodiment, the worst case and average computation times of the path analysis are reduced considerable by using computation hardware 210 with three parallel computational units 212, 214, 216, each of which is equivalent to the computational unit 200 shown in FIG. 10. The outputs of the equation selector decoder 124 are rearranged so that the two case IDs relevant to each computation unit are transmitted directly to that unit. Each computational unit 212, 214, 216 is programmed to perform only four of the twelve line intersection computations, for opposing sides of the obstacle. This system architecture guarantees that each computational unit will be assigned either zero or two computations during any one path analysis. Depending on the system architecture used, the three computational units could use a common set of registers, or each could have its own set of registers.

Since the computations to be performed by each computational unit are determined by the first case ID received by the unit, no computation loops are needed, saving about four CPU cycles. As a result, the worst case computation time for this embodiment is 10 CPU cycles for initialization, 7 CPU cycles for computation control, and 30 CPU cycles for two computations, for a grand total of 47 CPU cycles or 1.175 microseconds using a 40 Megahertz clock rate. Note that it in some cases just one computation is performed because a first comparison test fails, in which case the path intersection computations could be completed in as little as 29 CPU cycles, or 0.725 microsecond.

In yet other alternate embodiments, the computation time could be further reduced, for instance by using two arithmetic units in each of the three parallel computational units of FIG. 10.

FIG. 12 is a flow chart of the method of the invention. As discussed above, obstacle limits are written into a programmable comparator (step 240), and then the specified path endpoints A and B are converted by the programmable comparator into A and B map signals which specify the relationship of the path endpoints to the specified obstacle (step 240). The resulting A and B map signals are then decoded to determine whether the specified path is blocked, not-blocked or may-be blocked by the specified obstacle (step 242).

If the first identified configuration corresponds to a blocked or unblocked path, then the analysis of the path is done (step 244). Otherwise, the configuration corresponds to a path which may be blocked, and this ambiguity is resolved using the calculations corresponding to the identified configuration, as discussed above. In particular, in order to minimize the amount of computation to be performed, the first step of resolving the ambiguity is selecting the path endpoint from which the least number of sides of the obstacle can be viewed (step 246). Based on the selected path endpoint, a pair of line-plane intersection computations is performed for each side of the obstacle that is in view of the selected endpoint (steps 248 and 250). Each pair of intersection computations has a corresponding set of comparison tests, all of which are met only when the obstacle blocks the specified path.

In an alternate embodiment, the path analyzers does not include an hardware ambiguity resolver. Instead, the ambiguity resolution computations are performed by the host computer's CPU 104. Nevertheless, the same computation reduction techniques described above, most importantly including identification of the number of sides of the obstacle in view of the path endpoints, are used in this embodiment to make the computation as efficient as possible. Furthermore, in this alternate embodiment the host computer can load a large number of paths into the path analyzer for automatic processing, thereby overlapping as much as possible ambiguity resolution computations by the host computer with initial path analyses by the path analyzer.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A path analyzer, comprising
  a programmable comparator that converts a specified path's first and second endpoints in three dimensional space into first and second map signals, wherein each map signal indicates whether the corresponding path endpoint's position on predefined X, Y and Z coordinate axes is above, below or within a range of coordinate values associated with a specified obstacle; wherein said specified obstacle is specified by coordinate values corresponding to a rectangular parallelepiped having six sides;
  a first decoder that decodes said first and second map signals and generates a path analysis signal that specifies one of three path conditions selected from the group comprising: blocked (said specified path is blocked by said specified obstacle), unblocked (said specified path is not blocked by said specified obstacle), and may-be-blocked (said specified path may be blocked by said specified obstacle); and
  a dedicated computational unit, coupled to said first decoder, that is activated only when said first decoder generates a path analysis signal specifying a may-be-blocked path condition; said dedicated computational unit including (1) an arithmetic unit having a controller preprogrammed to perform selected ones of six predefined path intersection computations, each predefined path intersection computation determining whether any specified path intersects a distinct one of any specified obstacle's six sides; and (2) a second decoder that decodes said first and second map signals and generates identifier signals that identify a minimum number of said predefined path intersection computations necessary to determine whether said specified path is blocked by said specified obstacle; wherein said controller is coupled to second decoder for receiving said identifier signals and for directing said arithmetic unit to perform the ones of said predefined path intersection computations identified by said identifier signals.

2. The path analyzer of claim 1, wherein said first and second map signals indicate which of 27 predefined spatial relationships said first and second endpoints have with respect to said specified obstacle.

3. The path analyzer of claim 2, wherein said second decoder selects one of said first and second map signals in accordance with predefined computation minimization criteria, said predefined computation minimization criteria comprises selecting one of said first and second map signals so that the corresponding one of said first and second path endpoints is in view of no more sides of said specified object than the other one of said first and second path endpoints.

4. The path analyzer of claim 1, wherein said second decoder means includes a first logic circuit that selects one of said first and second map signals in accordance with predefined computation minimization criteria, and a memory coupled to said first logic circuit, said memory using said selected map signal as an address, the output of said memory being said identifier signals.

5. The path analyzer of claim 1, said dedicated computational unit including three parallel arithmetic units, each having a controller preprogrammed to perform a distinct subset of said six predefined path intersection computations, and control means for initiating computations by said arithmetic units in accordance with said identifier signals.

6. In a method of determining whether a specified path is blocked by a specified obstacle, converting a specified path's first and second endpoints in three dimensional space into first and second map signals, wherein each map signal indicates whether the corresponding path endpoint's position on predefined X, Y and Z coordinate axes is above, below or within a range of coordinate values associated with a specified obstacle; wherein said specified obstacle is specified by coordinate values corresponding to a rectangular parallelepiped having six sides;

decoding said first and second map signals so as to generate a path analysis signal that specifies one of three path conditions selected from the group comprising: blocked (said specified path is blocked by said specified obstacle), unblocked (said specified path is not blocked by said specified obstacle), and may-be-blocked (said specified path may be blocked by said specified obstacle ); and when said first decoding step generates a path analysis signal specifying a may-be-blocked path condition, further decoding said first and second map signals so as to generate identifier signals that identify a minimum number of one to three predefined path intersection computations necessary to determine whether said specified path is blocked by said specified obstacle; wherein said minimum number of predefined path intersection computations are selected from a set of six predefined path intersection computations, each predefined path intersection computation determining whether any:specified path intersects a distinct one of any specified obstacle's six sides; and performing said predefined path intersection computations identified by said identifier signals until said specified path is determined to be blocked or not-blocked by said specified obstacle.

7. The method of claim 6, wherein said second decoding step includes selecting one of said first and second map signals in accordance with predefined computation minimization criteria, and generating said identifier signals by reading said identifier signals from a lookup table using said selected map signal as a lookup address.

8. The method of claim 7, said performing step including performing each of said minimum number of predefined path intersection computations in parallel computational units.

9. The method of claim 6, wherein said first and second map signals indicate which of 27 predefined spatial relationships said first and second endpoints have with respect to said specified obstacle.

10. The method of claim 9, wherein said further decoding step selects one of said first and second map signals in accordance with predefined computation minimization criteria, said predefined computation minimization criteria comprises selecting one of said first and second map signals so that the corresponding one of said first and second path endpoints is in view of no more sides of said specified object than the other one of said first and second path endpoints.

* * * * *